US009406700B2

(12) United States Patent
Okumura et al.

(10) Patent No.: US 9,406,700 B2
(45) Date of Patent: Aug. 2, 2016

(54) THIN FILM TRANSISTORS WITH OXIDE SEMICONDUCTOR HAVING LOW RESISTANCE PATTERNS WITH OXYGEN DEFICIENCIES

(71) Applicant: Samsung Display Co., LTD., Yongin, Gyeonggi-Do (KR)

(72) Inventors: Hiroshi Okumura, Hwaseong-si (KR); Je-Hun Lee, Seoul (KR); Jin-Hyun Park, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/174,989

(22) Filed: Feb. 7, 2014

(65) Prior Publication Data

US 2015/0069336 A1 Mar. 12, 2015

(30) Foreign Application Priority Data

Sep. 11, 2013 (KR) .................. 10-2013-0109052

(51) Int. Cl.
*H01L 27/12* (2006.01)
*H01L 27/32* (2006.01)
*H01L 29/66* (2006.01)
*H01L 29/786* (2006.01)

(52) U.S. Cl.
CPC ........ *H01L 27/1225* (2013.01); *H01L 27/3244* (2013.01); *H01L 29/66969* (2013.01); *H01L 29/7869* (2013.01); *H01L 27/127* (2013.01); *H01L 27/1248* (2013.01)

(58) Field of Classification Search
CPC ............ H01L 27/1225; H01L 27/3244; H01L 27/127; H01L 29/66969; H01L 29/7869; H01L 27/1248; H01L 27/12
See application file for complete search history.

(56) References Cited

U.S. PATENT DOCUMENTS

| 2009/0225251 | A1 | 9/2009 | Kaitoh et al. |
| 2010/0025677 | A1 | 2/2010 | Yamazaki et al. |
| 2011/0017989 | A1* | 1/2011 | Chen .................. H01L 27/1225 257/43 |
| 2011/0215328 | A1 | 9/2011 | Morosawa et al. |
| 2011/0263082 | A1 | 10/2011 | Yamazaki |
| 2012/0112182 | A1 | 5/2012 | Ishii et al. |
| 2012/0161123 | A1* | 6/2012 | Yamazaki ......... H01L 29/66742 257/43 |
| 2012/0273780 | A1 | 11/2012 | Yamazaki et al. |
| 2013/0056738 | A1 | 3/2013 | Ikeda et al. |
| 2013/0082252 | A1* | 4/2013 | Yamazaki ......... H01L 29/66969 257/43 |
| 2013/0099231 | A1 | 4/2013 | Tochibayashi et al. |
| 2013/0099232 | A1 | 4/2013 | Cho et al. |

(Continued)

FOREIGN PATENT DOCUMENTS

| KR | 1020090042122 A | 4/2009 |
| KR | 1020100048796 A | 5/2010 |
| KR | 1020110056963 A | 5/2011 |

*Primary Examiner* — Peter Bradford
(74) *Attorney, Agent, or Firm* — Cantor Colburn, LLC

(57) ABSTRACT

A thin film transistor includes a gate electrode on a substrate, a gate insulation layer which covers the gate electrode on the substrate, an oxide semiconductor pattern which is disposed on the gate insulation layer and includes a channel portion superimposed over the gate electrode, and low resistance patterns provided at edges of the channel portion, respectively, and including oxygen vacancies, a channel passivation layer on the oxide semiconductor pattern, a reaction layer which covers the oxide semiconductor pattern and the channel passivation layer, and includes a metal oxide, and a source electrode and a drain electrode which contact the oxide semiconductor pattern.

13 Claims, 11 Drawing Sheets

(56) References Cited

U.S. PATENT DOCUMENTS

| | | |
|---|---|---|
| 2013/0153904 A1 | 6/2013 | Nishimura et al. |
| 2013/0168682 A1* | 7/2013 | Tu et al. .......................... 257/60 |
| 2013/0181214 A1* | 7/2013 | Yamazaki ........... H01L 29/7869 257/43 |
| 2013/0193431 A1* | 8/2013 | Yamazaki ......... H01L 29/78693 257/43 |
| 2013/0203214 A1* | 8/2013 | Isobe ................... H01L 21/0237 438/104 |
| 2014/0175435 A1* | 6/2014 | Yamazaki ......... H01L 29/78618 257/43 |
| 2014/0307194 A1* | 10/2014 | Suzumura et al. .............. 349/43 |

\* cited by examiner

THIN FILM TRANSISTORS WITH OXIDE SEMICONDUCTOR HAVING LOW RESISTANCE PATTERNS WITH OXYGEN DEFICIENCIES

This application claims priority to Korean Patent Application No. 10-2013-0109052 filed on Sep. 11, 2013, and all the benefits accruing therefrom under 35 U.S.C. §119, the entire disclosure of which is incorporated by reference herein.

BACKGROUND

1. Field

Exemplary embodiments relate to thin film transistors ("TFTs"), methods of manufacturing the same and display devices including the same. More particularly, exemplary embodiments relate to TFTs using an oxide semiconductor as an active layer, methods of manufacturing the same and display devices including the same.

2. Description of the Related Art

A conventional thin film transistor ("TFT") having a bottom gate structure may include a gate electrode on a substrate, a gate insulation layer on the gate electrode, and an active layer formed on the gate insulation layer and superimposed on the gate electrode. The TFT may further include a source electrode and a drain electrode contacting the active layer.

As for the conventional TFT, the active layer may include a semiconductor material such as amorphous silicon or polysilicon. However, when the active layer includes amorphous silicon, a display device may have a low operational speed due to reduced charge mobility in the active layer. When the active layer includes polysilicon, a uniform threshold voltage of the TFT may not be obtained despite a high operation speed.

Recently, an oxide semiconductor including a metal oxide is utilized for the active layer in order to overcome the aforementioned problems.

SUMMARY

Where an oxide semiconductor including a metal oxide is utilized for an active layer of a thin film transistor ("TFT"), the source electrode and the drain electrode may be in direct contact with the active layer without an impurity layer such as an n+ layer provided between the electrodes and the active layer. Thus, a resistance of the active layer may be increased and a parasitic capacitance may be generated between the source electrode and the gate electrode and/or between the drain electrode and the gate electrode.

Exemplary embodiments provide a TFT having improved electrical characteristics.

Exemplary embodiments provide a method of manufacturing a TFT having improved electrical characteristics.

Exemplary embodiments provide a display device including a TFT having improved electrical characteristics.

According to exemplary embodiments, a TFT includes a gate electrode on a substrate, a gate insulation layer which covers the gate electrode on the substrate, an oxide semiconductor pattern on the gate insulation layer, a channel passivation layer on the oxide semiconductor pattern, a reaction layer which covers the oxide semiconductor pattern and the channel passivation layer, a source electrode and a drain electrode. The oxide semiconductor pattern includes a channel portion superimposed over the gate electrode and low resistance patterns provided at edges of the channel portion, respectively. The low resistance patterns include oxygen vacancies. The reaction layer includes a metal oxide. The source electrode and the drain electrode contact the oxide semiconductor pattern.

In exemplary embodiments, the reaction layer may include aluminum oxide.

In exemplary embodiments, the reaction layer may further include oxygen atoms or oxygen ions transferred from the oxide semiconductor pattern.

In exemplary embodiments, the low resistance patterns may contact the reaction layer, and may have an oxygen content ratio lower than that of the channel portion.

In exemplary embodiments, the reaction layer may have a layer density in a range from about 2.0 grams per cubic centimeter ($g/cm^3$) to about 3.7 $g/cm^3$.

In exemplary embodiments, the reaction layer may have the layer density in a range from about 2.0 $g/cm^3$ to about 3.3 $g/cm^3$.

In exemplary embodiments, the reaction layer may have a thickness in a range from about 10 nanometers (nm) to about 100 nm.

In exemplary embodiments, the source electrode and the drain electrode may contact with the low resistance patterns, respectively, through contact holes defined in the reaction layer.

In exemplary embodiments, the source electrode and the drain electrode may be separated from the gate electrode in a plan view.

In exemplary embodiments, the oxide semiconductor pattern may further include contact portions which contact the source electrode and the drain electrode, respectively. The low resistance patterns may be respectively located between the contact portion and the channel portion.

In exemplary embodiments, the channel passivation layer may include a central portion superimposed over the gate electrode, and a peripheral portion which partially covers the contact portion.

In exemplary embodiments, the reaction layer may cover the channel passivation layer, the source electrode and the drain electrode. The reaction layer may contact the low resistance pattern.

According to exemplary embodiments, there is provided a method of manufacturing a thin film transistor. In the method, a gate electrode is disposed on a substrate. A gate insulation layer which covers the gate electrode is disposed on the substrate. An oxide semiconductor pattern is disposed on the gate insulation layer. A channel passivation layer is disposed on the oxide semiconductor pattern. The channel passivation layer is superimposed over the gate electrode. A reaction layer covering the oxide semiconductor pattern and the channel passivation layer is provided. The reaction layer includes a metal oxide. A portion of the oxide semiconductor pattern which contacts the reaction layer is transformed into a low resistance pattern including oxygen vacancies. A source electrode and a drain electrode are provided to contact the oxide semiconductor pattern.

In exemplary embodiments, the reaction layer may be provided by a sputtering process.

In exemplary embodiments, the reaction layer may have a layer density in a range from about 2.0 $g/cm^3$ to about 3.7 $g/cm^3$.

In exemplary embodiments, a heat treatment or an exposure process may be further performed after providing the reaction layer.

In exemplary embodiments, in the formation of the source electrode and the drain electrode, the reaction layer may be etched to provide a contact hole at least partially exposing the low resistance pattern. A conductive layer filling the contact hole is disposed on the reaction layer. The conductive layer may be etched such that the source electrode and the drain electrode are not superimposed over the gate electrode.

In exemplary embodiments, the channel passivation layer may include a central portion superimposed over the gate electrode, and a peripheral portion covering edge portions of the oxide semiconductor pattern. In the formation of the source electrode and the drain electrode, a conductive layer may be disposed on the channel passivation layer and the oxide semiconductor pattern. The conductive layer may be etched to provide the source electrode and the drain electrode on the peripheral portion of the channel passivation layer.

In exemplary embodiments, openings may be provided between the central portion and the source electrode and between the central portion and the drain electrode. The reaction layer may fill the openings.

According to exemplary embodiments, there is provided a display device. The display device include a gate electrode, a gate insulation layer, an oxide semiconductor pattern, a channel passivation layer, a reaction layer, a source electrode, a drain electrode, a first electrode, an organic light emitting layer and a second electrode. The gate electrode is disposed on a substrate. The gate insulation layer which covers the gate electrode is disposed on the substrate. The oxide semiconductor pattern is disposed on the gate insulation layer. The oxide semiconductor pattern includes a channel portion superimposed over the gate electrode, and low resistance patterns provided at edges of the channel portion. The low resistance pattern includes oxygen vacancies. The channel passivation layer is disposed on the oxide semiconductor pattern. The reaction layer covers the oxide semiconductor pattern and the channel passivation layer. The reaction layer includes a metal oxide. The source electrode and the drain electrode contact the oxide semiconductor pattern. The first electrode is electrically connected to the drain electrode. The organic light emitting layer is disposed on the first electrode. The second electrode is disposed on the organic light emitting layer.

BRIEF DESCRIPTION OF THE DRAWINGS

Exemplary embodiments will be more clearly understood from the following detailed description taken in conjunction with the accompanying drawings.

FIG. 1 is a cross-sectional view illustrating an exemplary embodiment of a thin film transistor ("TFT") in accordance with the invention;

FIG. 2 is a flow chart illustrating a method of manufacturing the TFT of FIG. 1;

FIGS. 3 to 7 are cross-sectional views illustrating a method of manufacturing the TFT of FIG. 1;

FIG. 8 a cross-sectional view illustrating an exemplary embodiment of a TFT in accordance with the invention;

FIG. 9 a flow chart illustrating a method of manufacturing the TFT of FIG. 8;

FIGS. 10 to 13 are cross-sectional views illustrating a method of manufacturing the TFT of FIG. 8;

FIG. 14 is a cross-sectional view illustrating an exemplary embodiment of a TFT in accordance with the invention;

FIG. 15 is a graph showing measured resistance values of oxide semiconductor patterns in accordance with Examples and a Comparative Example;

FIG. 16 is a cross-sectional view illustrating a display device in accordance with exemplary embodiments;

FIGS. 17 to 19 are cross-sectional views illustrating an exemplary embodiment of a method of manufacturing a display device in accordance with the invention.

DETAILED DESCRIPTION

Figure 1:
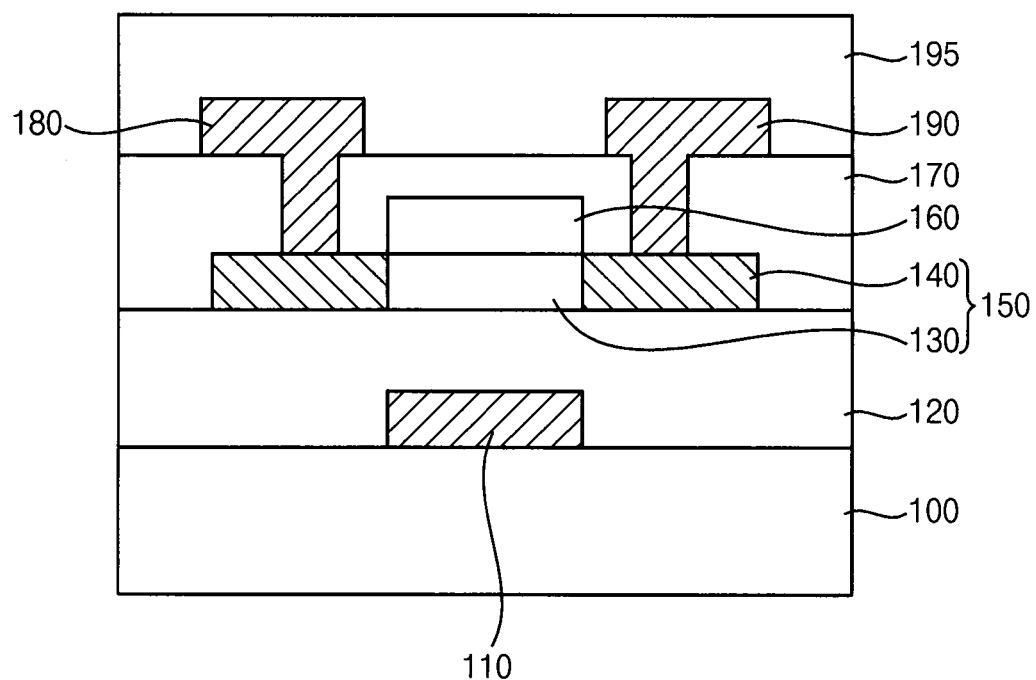
FIGS. 1 to 19 represent non-limiting, exemplary embodiments as described herein.

Various exemplary embodiments will be described more fully hereinafter with reference to the accompanying drawings, in which exemplary embodiments are shown. The inventive concept may, however, be embodied in many different forms and should not be construed as limited to the exemplary embodiments set forth herein. Rather, these exemplary embodiments are provided so that this invention will be thorough and complete, and will fully convey the scope of the inventive concept to those skilled in the art. In the drawings, the sizes and relative sizes of layers and regions may be exaggerated for clarity. Like numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third etc. may be used herein to describe various elements, these elements should not be limited by these terms. These terms are used to distinguish one element from another. Thus, a first element discussed below could be termed a second element without departing from the teachings of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a thin film transistor ("TFT") in accordance with exemplary embodiments. In an exemplary embodiment, FIG. 1 illustrates a TFT having a bottom gate structure in which a gate electrode is disposed under a semiconductor pattern.

Referring to FIG. 1, the TFT may include a gate electrode 110, a gate insulation layer 120, an oxide semiconductor pattern 150, a channel passivation layer 160, a reaction layer 170, a source electrode 180 and a drain electrode 190 on a substrate 100.

The substrate 100 may include a transparent insulation substrate. In an exemplary embodiment, the substrate may include a glass substrate, a transparent plastic substrate or a transparent metal oxide substrate, for example.

In one exemplary embodiment, a buffer layer (not illustrated) may be disposed on the substrate 100. The buffer layer may prevent impurities from being diffused to the substrate 100 and may improve flatness throughout the substrate 100. Further, the buffer layer may effectively reduce a stress that may be generated during a formation of the gate electrode. In an exemplary embodiment, the buffer layer may include, for example, silicon oxide (SiOx), silicon nitride (SiNx) or silicon oxynitride (SiOxNy).

The gate electrode 110 may be disposed on the substrate 100, and the gate insulation layer 120 covering the gate electrode 110 may be disposed on the substrate 100.

In an exemplary embodiment, the gate electrode 110 may have a substantially rectangular cross section as illustrated in FIG. 1. However, the invention is not limited thereto, and the gate electrode 110 may have a substantially trapezoidal cross section. The gate electrode 110 may have a single-layered structure or a multi-layered structure including a plurality of conductive layers.

The gate electrode 110 may include a metal, an alloy or a metal nitride. In an exemplary embodiment, the gate electrode 110 may include the metal including aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc) or the alloy thereof or the nitride thereof. In an alternative exemplary embodiment, the gate electrode 110 may include a conductive metal oxide including indium tin oxide ("ITO"), zinc tin oxide ("ZTO"), indium zinc oxide ("IZO"), aluminum doped zinc oxide ("AZO") or any combinations thereof, for example.

The gate electrode 110 may be electrically connected to a gate line (not illustrated) of a display device in which the TFT is employed.

The gate insulation layer 120 may sufficiently cover the gate electrode 110 to have a substantially leveled or even top surface. In an alternative exemplary embodiment the gate insulation layer 120 may have a stepped portion corresponding to the gate electrode 110.

The gate insulation layer 120 may include an insulation material including a silicon material or a metal oxide. In an exemplary embodiment, the gate insulation layer 120 may include silicon oxide, silicon nitride, silicon oxynitride, aluminum oxide (AlOx), tantalum oxide (TaOx), hafnium oxide (HfOx), zirconium oxide (ZrOx), titanium oxide (TiOx) or any combinations thereof. The gate insulation layer 120 may have a single-layered structure or a multi-layered structure including the silicon material and/or the metal oxide.

The oxide semiconductor pattern 150 may be disposed on the gate insulation layer 120 to be superimposed over the gate electrode 110.

In an exemplary embodiment, the oxide semiconductor pattern 150 may include a semiconductor oxide material including indium (In), zinc (Zn), gallium (Ga), tin (Sn), titanium (Ti), aluminum (Al), hafnium (Hf), zirconium (Zr), magnesium (Mg) or any combinations thereof. In an exemplary embodiment, the oxide semiconductor pattern 150 may include a binary compound (ABx), a ternary compound (ABxCy), a quaternary compound (ABxCyDz) or any combinations thereof. In an exemplary embodiment, the oxide semiconductor pattern 150 may include indium gallium zinc oxide ("IGZO"), indium tin zinc oxide ("ITZO"), gallium zinc oxide (GaZnxOy), indium zinc oxide ("IZO"), zinc magnesium oxide (ZnMgxOy), zinc tin oxide (ZnSnxOy), zinc zirconium oxide (ZnZrxOy), zinc oxide (ZnOx), gallium oxide (GaOx), tin oxide (SnOx), indium oxide (InOx), indium gallium hafnium oxide ("IGHO"), tin aluminum zinc oxide ("TAZO"), indium gallium tin oxide ("IGSO") or any combinations thereof. In one exemplary embodiment, the oxide semiconductor pattern 150 may further include dopants including lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), or any combinations thereof. The oxide semiconductor pattern 150 may have a single-layered structure or a multi-layered structure including at least one of the semiconductor oxide materials. In exemplary embodiments, the oxide semiconductor pattern 150 may include IGZO or ITZO, for example.

The oxide semiconductor pattern 150 may include low resistance patterns 140 provided (e.g., formed) at edge portions or peripheral portions of the oxide semiconductor pattern 150, and a channel portion 130 at a central portion of the oxide semiconductor pattern 150.

In exemplary embodiments, the low resistance pattern 140 may include oxygen vacancies more than those of the channel portion 130, and may have a resistance lower than that of the channel portion 130. Thus, the low resistance pattern 140 may have an oxygen content ratio lower than that of the channel portion 130.

The channel portion 130 may be substantially superimposed over the gate electrode 110 to function as a path through which charges or ions may be moved or transferred.

The channel passivation layer 160 may be disposed on the channel portion 130 to be substantially superimposed over the gate electrode 110. In exemplary embodiments, a boundary between the low resistance pattern 140 and the channel portion 130 may be determined by the channel passivation layer 160. In an exemplary embodiment, the channel passivation layer 160 may include, for example, silicon oxide.

The reaction layer 170 may be disposed on the gate insulation layer 120 to cover the oxide semiconductor pattern 150 and the channel passivation layer 160. The reaction layer 170 may include a metal oxide including titanium oxide (TiOx), aluminum oxide (AlOx), zirconium oxide (ZrOx), magnesium oxide (MgOx), tantalum oxide (TaOx), molybdenum oxide (MoOx), neodymium oxide (NdOx), or any combination thereof. In exemplary embodiments, the reaction layer 170 may include aluminum oxide.

The reaction layer 170 may include oxygen atoms or oxygen ions that may be moved or transferred from the oxide semiconductor pattern 150. Accordingly, a portion of the oxide semiconductor pattern 150 which contacts the reaction layer 170 may be transformed into the low resistance pattern 140 that may be relatively oxygen-deficient. In exemplary embodiments, the reaction layer 170 may have an oxygen content ratio lower than that of the low resistance pattern 140.

In exemplary embodiments, the reaction layer 170 may have a thickness taken in a cross section in a range from about 10 nanometers (nm) to about 100 nm. When the thickness of the reaction layer 170 is less than about 10 nm, an economic efficiency of manufacturing the TFT may be deteriorated and the reaction layer 170 may not accommodate the sufficient oxygen atoms or oxygen ions from the oxide semiconductor pattern 150. When the thickness of the reaction layer 170 is greater than about 100 nm, a charge transfer path through the source electrode 180 or the drain electrode 190 may be increased, so that electrical characteristics of the TFT such as a signal transmission rate may be deteriorated.

In exemplary embodiments, a layer density of the reaction layer 170 may be in a range from about 2.0 grams per cubic centimeter (g/cm$^3$) to about 3.7 g/cm$^3$. As the layer density of the reaction layer 170 becomes smaller, the reaction between the reaction layer 170 and the oxide semiconductor pattern 150 may be facilitated. When the layer density of the reaction layer 170 is greater than about 3.7 g/cm$^3$, the reaction may not substantially occur. When the layer density of the reaction layer 170 is less than about 2.0 g/cm$^3$, mechanical properties of the TFT such as a heat resistance and a pressure resistance or insulation properties of the reaction layer 170 may be deteriorated. In one exemplary embodiment, the layer density of the reaction layer 170 may be in a range from about 2.0 g/cm$^3$ to about 3.3 g/cm$^3$ to obtain a sufficient reactivity with the oxide semiconductor pattern 150.

The source electrode 180 and the drain electrode 190 may be disposed in contact holes defined through the reaction layer 170 and may contact the low resistance patterns 140 provided at the edge portions or the peripheral portions of the oxide semiconductor pattern 150. In an exemplary embodiment, the source electrode 180 and the drain electrode 190 may include a metal including Al, Cu, Mo and Ti or an alloy thereof. In an alternative exemplary embodiment, the source electrode 180 and the drain electrode 190 may include a transparent conductive material including ITO, IZO, AZO or any combinations thereof.

The source electrode 180 may be electrically connected with a data line (not illustrated) of the display device to provide the TFT with a power and/or a current. The drain electrode 190 may be electrically connected with a pixel electrode (not illustrated) of the display device.

In exemplary embodiments, the source electrode 180 and the drain electrode 190 may not be superimposed over the gate electrode 110. Accordingly, a parasitic capacitance generated between the source electrode 180 and the gate electrode 110 and/or between the drain electrode 190 and the gate electrode 110 may be minimized.

In the case that a polysilicon layer or an amorphous silicon layer is utilized as an active layer, an n+ layer or an ohmic contact layer which contacts a source electrode and a drain electrode may be provided. In an alternative exemplary embodiment, when an oxide semiconductor layer is utilized as the active layer, the source electrode and the drain electrode may directly contact the oxide semiconductor layer. Thus, a contact resistance between the source electrode and the oxide semiconductor layer and/or between the drain electrode and the oxide semiconductor layer may be increased. Accordingly, the source electrode and the drain electrode may be superimposed over a gate electrode to facilitate mobility or transfer of the charges or the ions. In this case, a parasitic capacitance may be generated between the source electrode and the gate electrode and/or between the drain electrode and the gate electrode.

However, according to the TFT of exemplary embodiments, the low resistance patterns 140 may be provided at the edge portions of the oxide semiconductor pattern 150. The low resistance pattern 140 may include the oxygen vacancies that may function as charge carriers, so that a contact resistance between the low resistance pattern 140 and the source electrode 180 and/or between the low resistance pattern 140 and the drain electrode 190 may be reduced. Therefore, even though each of the source electrode 180 and the drain electrode 190 is spaced apart from the gate electrode 110 and is not substantially superimposed over the gate electrode 110, the sufficient mobility or transfer of the charges or the ions may be achieved. Further, the source electrode 180 and the drain electrode 190 may not be superimposed over the gate electrode 100 as mentioned above, so that the generation of the parasitic capacitance may be minimized.

A passivation layer 195 may be additionally disposed on the reaction layer 170 to cover the source electrode 180 and the drain electrode 190. In an exemplary embodiment, the passivation layer 195 may include an insulation material including silicon oxide or silicon nitride, for example.

Figure 2:
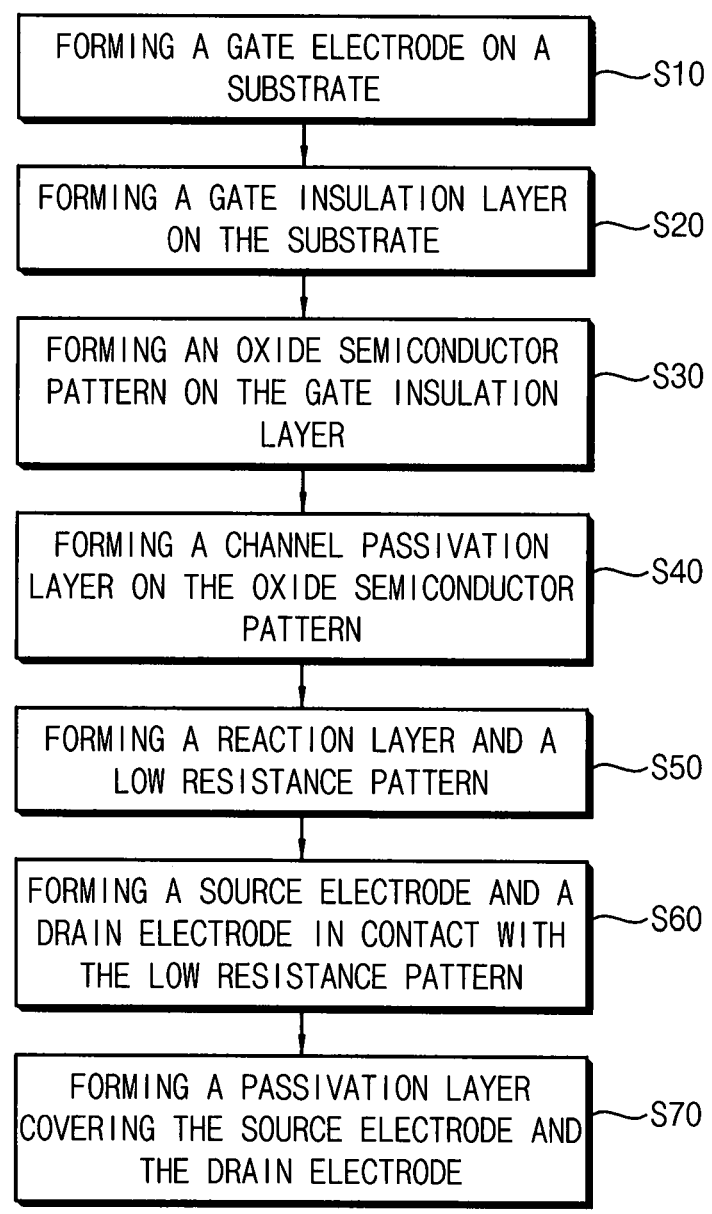

FIG. 2 is a flow chart illustrating a method of manufacturing the TFT of FIG. 1. FIGS. 3 to 7 are cross-sectional views illustrating a method of manufacturing the TFT of FIG. 1.

Figure 3:
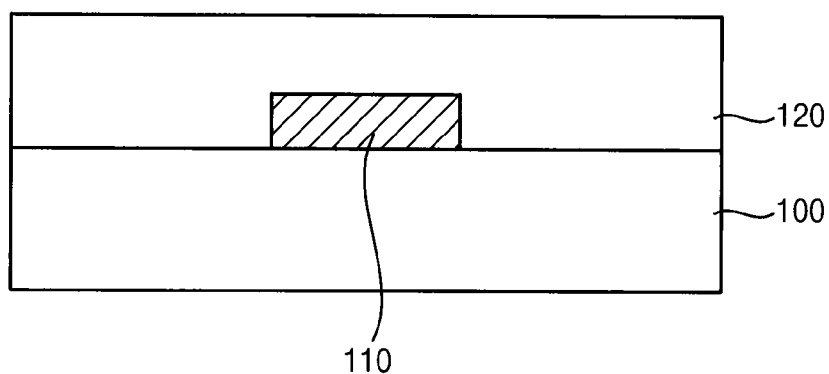

Referring to FIGS. 2 and 3, a gate electrode 110 may be disposed on a substrate 100 in operation S10.

In an exemplary embodiment, the substrate 100 may include a transparent insulation substrate including a glass substrate, a transparent plastic substrate or a transparent metal oxide substrate.

A first conductive layer may be disposed on the substrate 100, and then the first conductive layer may be patterned by, e.g., a photolithography process to provide the gate electrode 110. In an exemplary embodiment, the first conductive layer may be provided using a metal, an alloy or a metal nitride, for example. In an exemplary embodiment, the first conductive layer may be provided using the metal including aluminum, silver, tungsten, copper, nickel, chrome, molybdenum, titanium, platinum, tantalum, neodymium, scandium, or the alloy thereof or the nitride thereof, for example. In an alternative exemplary embodiment, the first conductive layer may be provided using a transparent conductive material including ITO, IZO, AZO or any combinations thereof. In an alternative exemplary embodiment, the first conductive layer may be obtained by a sputtering process, an atomic layer deposition ("ALD") process, a pulse laser deposition ("PLD") process, a vacuum evaporation process, etc.

When the TFT is utilized for a display device, the gate electrode 110 may be integrally provided with a gate line (not illustrated) of the display device by the same patterning process.

In one exemplary embodiment, a buffer layer (not illustrated) may be additionally disposed on the substrate 100 before providing the gate electrode 110. In an exemplary embodiment, the buffer layer may be provided using, e.g., silicon oxide, silicon nitride or silicon oxynitride, for example. In an exemplary embodiment, the buffer layer may be obtained by a chemical vapor deposition ("CVD") process, a plasma enhanced chemical vapor deposition ("PECVD") process, a high density plasma-chemical vapor deposition ("HDP-CVD") process, etc.

In operation S20, a gate insulation layer 120 covering the gate electrode 110 may be disposed on the substrate 100. The gate insulation layer 120 may be provided using a silicon material including silicon oxide, silicon nitride, a metal oxide or any combinations thereof. In an exemplary embodiment, the gate insulation layer 120 may be obtained by a CVD process, a PECVD process, a vacuum evaporation process, etc. The gate insulation layer 120 may have a single-layered structure or a multi-layered structure including the silicon material and/or the metal oxide.

As illustrated in FIG. 3, the gate insulation layer 120 may have a substantially even or leveled top surface. However, when the gate insulation layer 120 has a thin thickness, the gate insulation layer 120 may have an uneven top surface or a stepped portion corresponding to the gate electrode 110.

Figure 4:
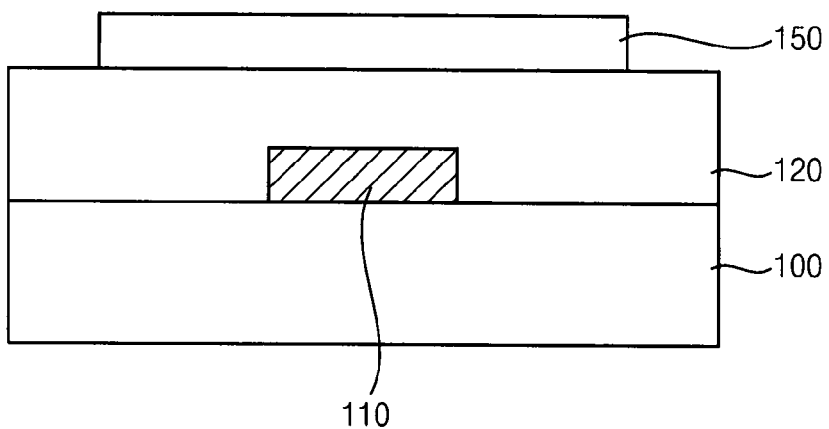

Referring to FIGS. 2 and 4, an oxide semiconductor pattern 150 may be disposed on the gate insulation layer 120 in operation S30.

In exemplary embodiments, an oxide semiconductor layer may be disposed on the gate insulation layer 120 using a semiconductor oxide material that may include In, Zn, Ga, Sn, Ti, Al, Hf, Zr, Mg or any combinations thereof. The oxide semiconductor layer may be patterned by, e.g., a photolithography process to obtain the oxide semiconductor pattern 150.

In an exemplary embodiment, the semiconductor oxide material may include a binary compound (ABx), a ternary compound (ABxCy) or a quaternary compound (ABxCyDz) including ITZO, IGZO, GaZnxOy, ITO, IZO, ZnMgxOy, ZnSnxOy, ZnZrxOy, ZnOx, SnOx, InOx, IGHO, TAZO, IGSO or any combinations thereof. In one exemplary embodiment, a dopant including Li, Na, Mn, Ni, Pd, Cu, C, N, P, Ti, Zr, V, Ru, Ge, Sn, F or any combinations thereof may be added to the semiconductor oxide material. The oxide semiconductor layer may be provided by a sputtering process, an ALD process, a PLD process, etc.

Figure 5:
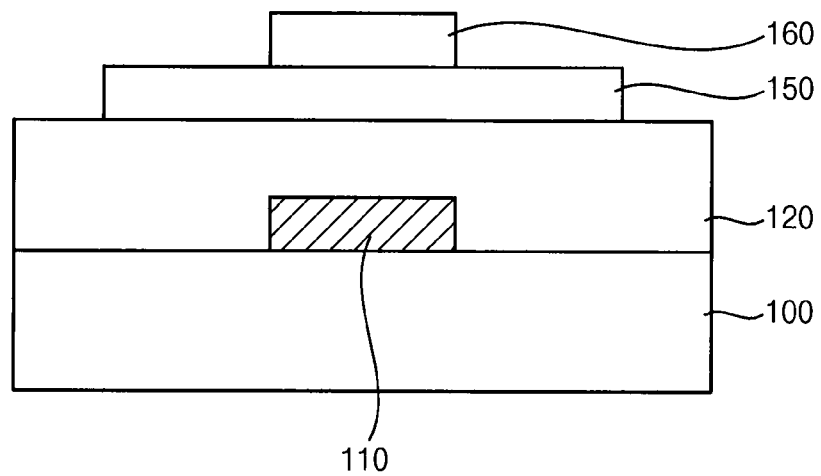

Referring to FIGS. 2 and 5, a channel passivation layer 160 may be disposed on the oxide semiconductor pattern 150 in operation S40.

In exemplary embodiments, a passivation layer covering the oxide semiconductor pattern 150 may be disposed on the gate insulation layer 120. The passivation layer may be partially removed by, e.g., a photolithography process to obtain the channel passivation layer 160. The channel passivation layer 160 may be substantially superimposed over the gate electrode 110.

In one exemplary embodiment, a photoresist layer may be disposed on the passivation layer, and then an exposure process may be performed from a back surface using the gate electrode 110 as a mask. A developing process may be performed to provide a photoresist pattern on the passivation layer. The passivation layer may be partially removed by, e.g., a dry etching process using the photoresist pattern as an etching mask to obtain the channel passivation layer 160.

As illustrated in FIG. 5, the channel passivation layer 160 may have a substantially rectangular cross section. In an alternative exemplary embodiment, the channel passivation layer 160 may have a substantially trapezoidal cross section with tapered sidewalls by modifying etching conditions such as a reaction gas or an etching time.

Figure 6:
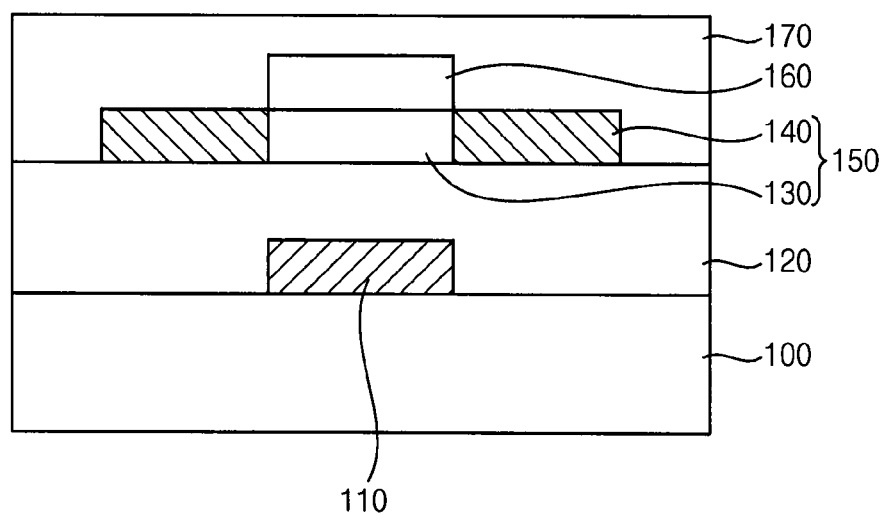

Referring to FIGS. 2 and 6, a reaction layer 170 covering the oxide semiconductor pattern 150 and the channel passivation layer 160 may be disposed on the gate insulation layer 120, and a portion of the oxide semiconductor pattern 150 which contacts the reaction layer 170 may be transformed into a low resistance pattern 140 in operation S50.

In an exemplary embodiment, the reaction layer 170 may be provided using a metal oxide including TiOx, AlOx, ZrOx, MgOx, TaOx, MoOx, NdOx, or any combinations thereof. In exemplary embodiments, the reaction layer 170 may be provided using AlOx. In an exemplary embodiment, the reaction layer 170 may be obtained by a sputtering process, an ALD process, a PLD process, etc. In exemplary embodiments, the sputtering process may be utilized in order to obtain a desired layer density of the reaction layer 170.

The portion of the oxide semiconductor pattern 150 which contacts the reaction layer 170 may be transformed into the low resistance pattern 140. In exemplary embodiments, the reaction layer 170 may have an oxygen content ratio lower than that of the oxide semiconductor pattern 150. A portion of the oxide semiconductor pattern 150 which is not covered by the channel passivation layer 160 may contact the reaction layer 170, and oxygen atoms or oxygen ions included in the oxide semiconductor pattern 150 may be moved or transferred into the reaction layer 170. Accordingly, the portion of the oxide semiconductor pattern 150 which contacts reaction layer 170 may be transformed into the low resistance pattern 140 relatively deficient in oxygen. The low resistance pattern 140 may include oxygen vacancies that may function as carriers, thereby have a relatively high electrical conductivity and a low resistance.

In one exemplary embodiment, a thermal treatment such as an annealing process or an exposure process using laser or ultraviolet ("UV") light may be further performed to facilitate the reaction between the reaction layer 170 and the oxide semiconductor pattern 150.

As illustrated in FIG. 1, a thickness of the reaction layer 170 may be in a range from about 10 nm to about 100 nm. The reaction layer 170 may have a substantially even or leveled top surface in the range of the thickness.

As illustrated above, a layer density of the reaction layer 170 may be in a range of from about 2.0 g/cm$^3$ to about 3.7 g/cm$^3$. In one exemplary embodiment, the layer density of the reaction layer 170 may be in a range of from about 2.0 g/cm$^3$ to about 3.3 g/cm$^3$ to obtain a sufficient reactivity with the oxide semiconductor pattern 150. A sputtering process may be more advantageous than an ALD process or a PLD process in order to obtain the layer density of less than about 3.7 g/cm$^3$.

A portion between the low resistance patterns 140 of the oxide semiconductor pattern 150 may be defined as a channel portion 130. In exemplary embodiments, the low resistance pattern 140 may have the oxygen content ratio lower than that of the channel portion 130.

Figure 7:
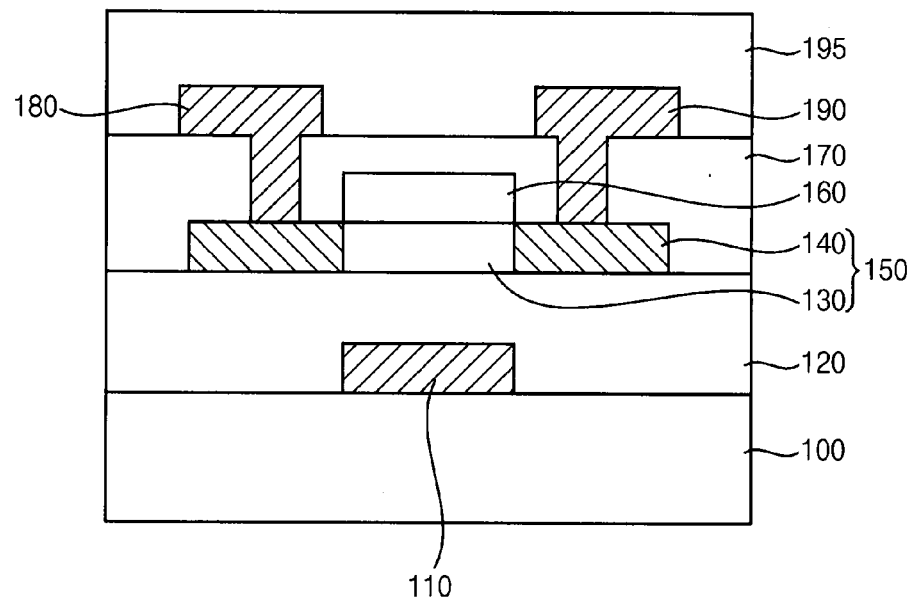

Referring to FIGS. 2 and 7, a source electrode 180 and a drain electrode 190 that may contact the low resistance patterns 140 may be disposed in contact holes defined through the reaction layer 170 in operation S60.

In exemplary embodiments, the reaction layer 170 may be partially removed by, e.g., a photolithography process to define the contact holes at least partially exposing the low resistance patterns 140 provided at both ends of the oxide semiconductor pattern 150. A second conductive layer may be disposed on the reaction layer 170 and the exposed low resistance patterns 140 to fill the contact holes. The second conductive layer may be patterned to provide the source electrode 180 and the drain electrode 190.

The second conductive layer may be provided using a metal including Al, Cu, Mo, Ti or an alloy thereof, or a transparent conductive material including ITO, IZO, AZO or any combinations thereof. The second conductive layer may be obtained by a sputtering process, an ALD process, a PLD process, etc.

In exemplary embodiments, the source electrode 180 and the drain electrode 190 may not be superimposed over the channel passivation layer 160 and/or the gate electrode 110. For example, the source electrode 180 and the drain electrode 190 may be spaced apart from the channel passivation layer 160 and/or the gate electrode 110 in a transverse direction by a predetermined distance. Therefore, the generation of a parasitic capacitance between the source electrode 180 and the gate electrode 110, and/or between the drain electrode 190 and the gate electrode 110 may be minimized.

When the TFT is utilized for the display device, the source electrode 180 and the drain electrode 190 may be provided together with a data line (not illustrated) of the display device. In this case, the source electrode 180 may be integrally provided with the data line.

In operation S70, a passivation layer 195 may be disposed on the reaction layer 170 to cover the source electrode 180 and the drain electrode 190. In an exemplary embodiment, the passivation layer 195 may be provided using an insulation material including silicon oxide or silicon nitride by, e.g., a CVD process, a PECVD process, a spin coating process, etc.

Figure 8:
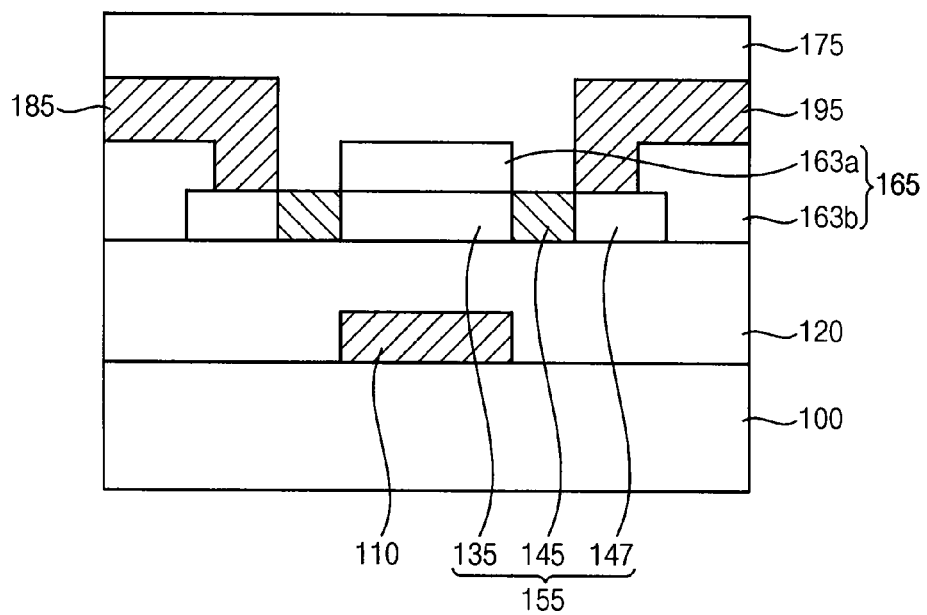

FIG. 8 a cross-sectional view illustrating a TFT in accordance with another exemplary embodiment. Detailed descriptions on elements and/or constructions substantially the same as or similar to those illustrated with reference to FIG. 1 are omitted. Further, like elements are indicated by like reference numerals.

Referring to FIG. 8, the TFT may include a gate electrode 110 and a gate insulation layer 120 covering the gate electrode 110 on a substrate 100.

An oxide semiconductor pattern 155 may be disposed on the gate insulation layer 120, and may include a channel portion 135, a low resistance pattern 145 and a contact portion 147. The channel portion 135 may be located at a central portion of the oxide semiconductor pattern 155, and may be substantially superimposed over the gate electrode 110. The contact portions 147 may be located at edge portions or peripheral portions of the oxide semiconductor pattern 155. The low resistance pattern 145 may be provided between the channel portion 135 and the contact portion 147.

In exemplary embodiments, the low resistance pattern 145 may include oxygen vacancies greater than those of the channel portion 135 and the contact portion 147. Further, the low resistance pattern 145 may have an oxygen content ratio lower than those of the channel portion 135 and the contact portion 147. The channel portion 135 and the contact portion 147 may have substantially the same material or composition as each other.

A channel passivation layer 165 may be disposed on the gate insulation layer 120 to partially expose the oxide semiconductor pattern 155. In exemplary embodiments, the channel passivation layer 165 may include a central portion 163*a* and a peripheral portion 163*b*. The central portion 163*a* of the channel passivation layer 165 may cover the channel portion 135 and may be substantially superimposed over the gate electrode 110. The peripheral portion 163*b* of the channel passivation layer 165 may cover both edges of the oxide semiconductor pattern 155. In exemplary embodiments, the peripheral portion 163*b* of the channel passivation layer 165 may partially cover the contact portion 147.

A source electrode 185 and a drain electrode 195 may be disposed on the peripheral portions 163*b* of the channel passivation layer 165 to contact the contact portions 147 of the oxide semiconductor pattern 155.

A reaction layer 175 may cover the source electrode 185, the drain electrode 195 and the channel passivation layer 165, and may contact the low resistance pattern 145. In exemplary embodiments, the reaction layer 175 may include oxygen atoms or oxygen ions moved or transferred from the oxide semiconductor pattern 155. Accordingly, a portion of the oxide semiconductor pattern 155 which contacts the reaction layer 175 may be transformed into the low resistance pattern 145 that may be relatively deficient in oxygen.

As mentioned above, the reaction layer 175 has a layer density in a range from about 2.0 g/cm$^3$ to about 3.7 g/cm$^3$. In one exemplary embodiment, the layer density may be in a range from about 2.0 g/cm$^3$ to about 3.3 g/cm$^3$.

The reaction layer 175 may also function as a passivation layer that covers the source electrode 185, the drain electrode 195, the channel passivation layer 165 and the oxide semiconductor pattern 155.

Figure 9:
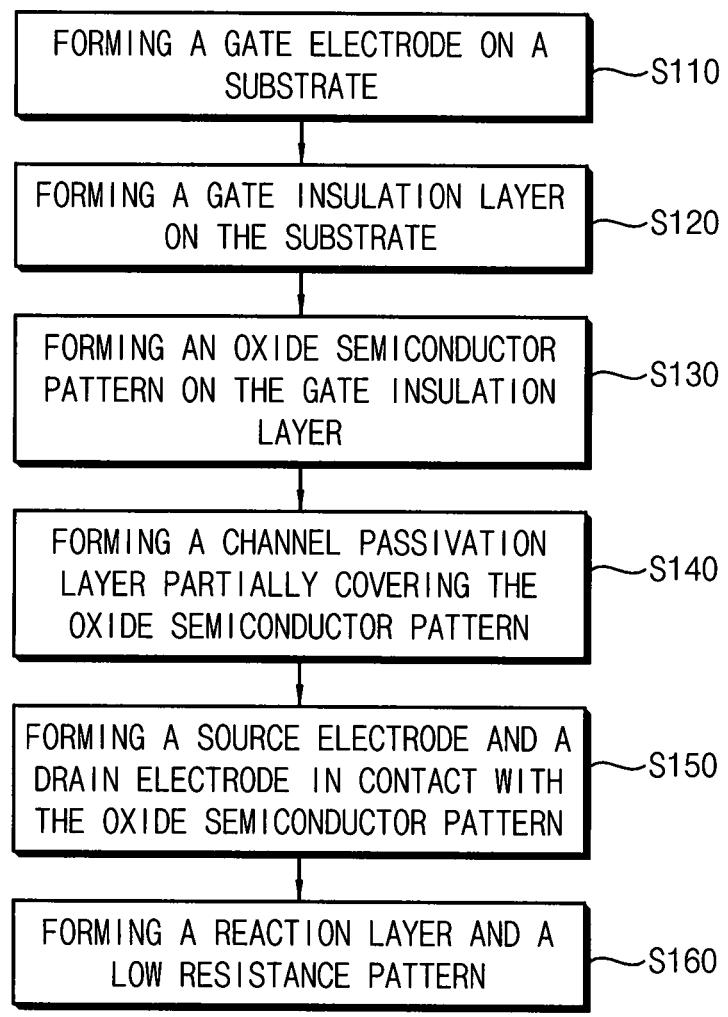

FIG. 9 a flow chart illustrating a method of manufacturing the TFT of FIG. 8. FIGS. 10 to 13 are cross-sectional views illustrating the method of manufacturing the TFT of FIG. 8. Detailed descriptions on processes and/or materials substantially the same as or similar to those illustrated with reference to FIG. 2 and FIGS. 3 to 7 are omitted.

Figure 10:
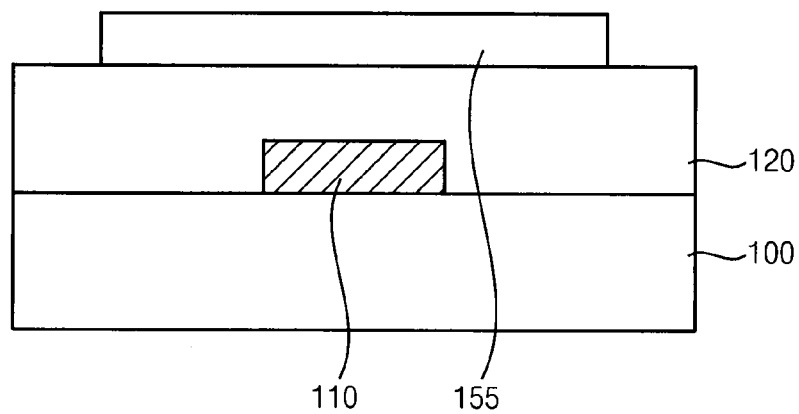

Referring to FIGS. 9 and 10, processes substantially the same as or similar to those illustrated with reference to FIGS. 3 and 4 may be performed.

Accordingly, a gate electrode 110 and a gate insulation layer 120 covering the gate electrode 110 may be disposed on a substrate 100 in operations S110 and S120. Subsequently, an oxide semiconductor pattern 155 may be disposed on the gate insulation layer 120 in operation S130.

Figure 11:
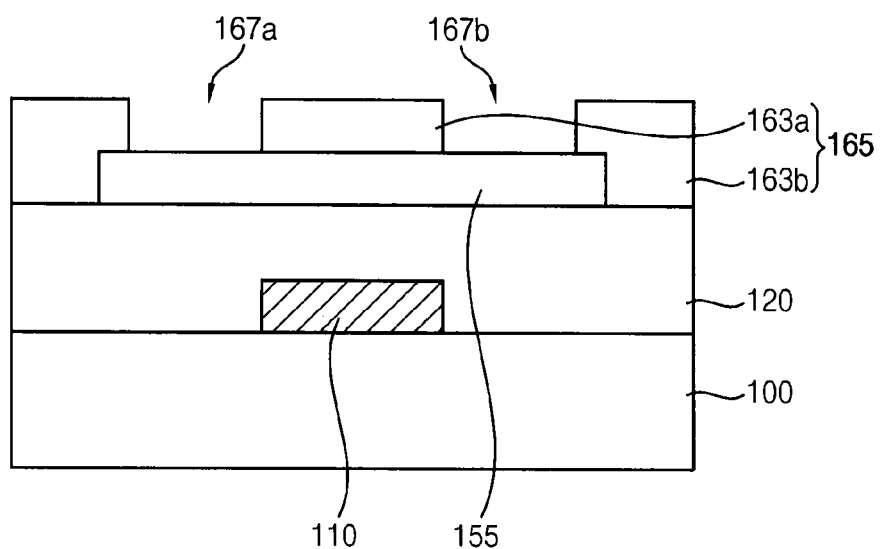

Referring to FIGS. 9 and 11, a channel passivation layer 165 partially covering the oxide semiconductor pattern 155 may be disposed on the gate insulation layer 120 in operation S140.

In exemplary embodiments, a passivation layer covering the oxide semiconductor pattern 155 may be disposed on the gate insulation layer 120, and then the passivation layer may be patterned by, e.g., a photolithography process to obtain the channel passivation layer 165. In the photolithography process, a photoresist layer may be disposed on the passivation layer. A mask pattern (not illustrated) overlapping edge portions or peripheral portions of the oxide semiconductor pattern 155 may be disposed on a back surface of the substrate 100, and an exposure process may be performed using the mask pattern and the gate electrode 110 as a mask. Exposed portions of the photoresist layer may be removed by a developing process to obtain a photoresist pattern. The passivation layer may be partially removed using the photoresist pattern as an etching mask to obtain the channel passivation layer 165.

In exemplary embodiments, the channel passivation layer 165 may be divided into a central portion 163*a* and peripheral portions 163*b*. The central portion 163*a* may be substantially superimposed over the gate electrode 110, and the peripheral portions 163*b* may cover the edge portions of the oxide semiconductor pattern 155.

Further, first openings 167a and 167b partially exposing the oxide semiconductor pattern 155 may be defined in the channel passivation layer 165.

Figure 12:
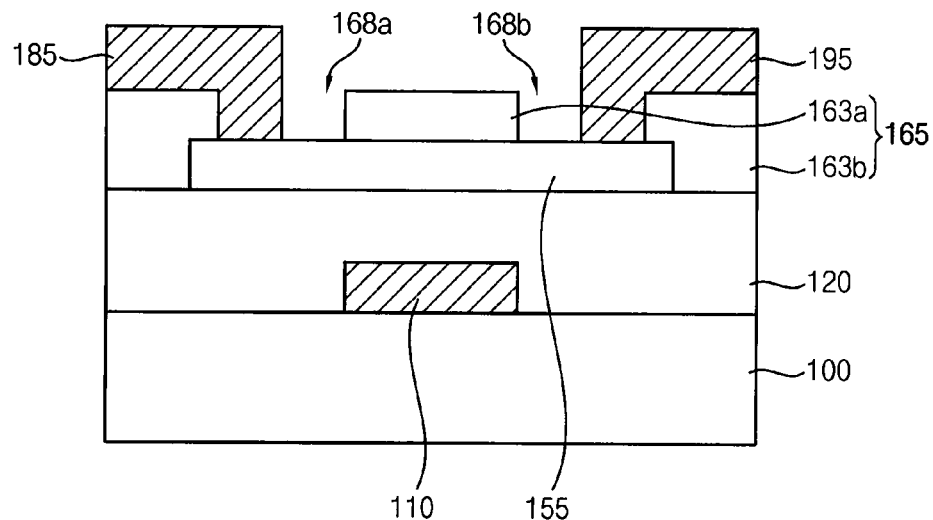

Referring to FIGS. 9 and 12, a source electrode 185 and a drain electrode 195 may be disposed on the peripheral portion 163b of the channel passivation layer 165 to contact the oxide semiconductor pattern 155 in operation S150.

In exemplary embodiments, the source electrode 185 and the drain electrode 195 may partially fill the first openings 167a and 167b, respectively. Accordingly, second openings 168a and 168b may partially expose the oxide semiconductor pattern 155 between the source electrode 185 and the central portion 163a of the channel passivation layer 165, and between the drain electrode 195 and the central portion 163a of the channel passivation layer 165.

In exemplary embodiments, a conductive layer may be disposed on the channel passivation layer 165 and the oxide semiconductor pattern 155. An etching mask overlapping with the peripheral portion 163b of the channel passivation layer 165 and a portion of the oxide semiconductor pattern 155 exposed by the first openings 167a and 167b may be disposed on the conductive layer. The conductive layer may be partially removed using the etching mask to provide the source electrode 185 and the drain electrode 195, and the second openings 168a and 168b partially exposing the oxide semiconductor pattern 155 may be defined.

In the above mentioned process, the central portion 163a of the channel passivation layer 165 may substantially function as an etch-stop layer to protect a channel portion 135 that may be provided in a subsequent process.

Figure 13:
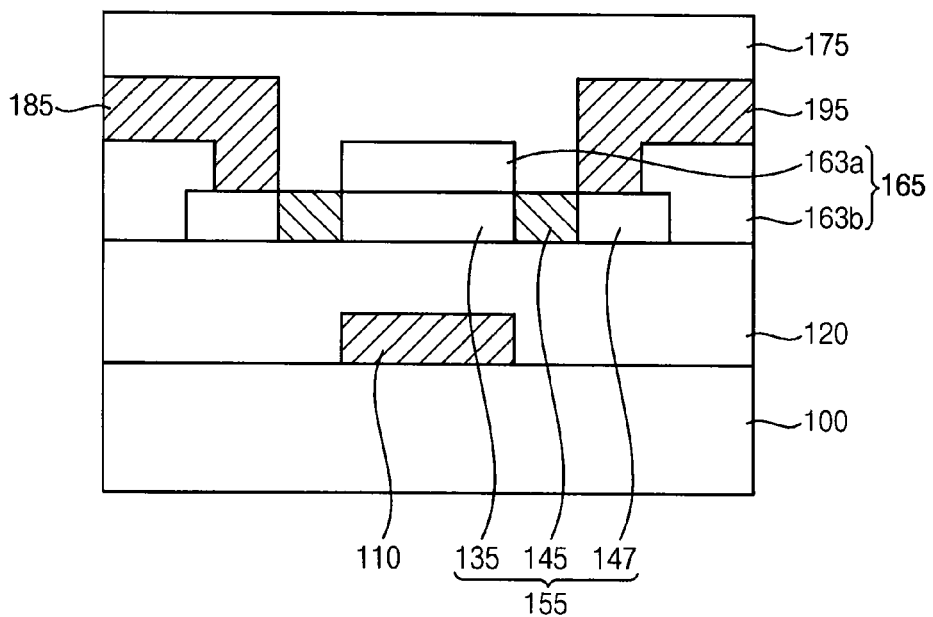

Referring to FIGS. 9 and 13, a reaction layer 175 covering the source electrode 185, the drain electrode 195 and the channel passivation layer 165 may fill the second openings 168a and 168b in operation S160. Accordingly, the reaction layer 175 may contact the oxide semiconductor pattern 155 exposed by the second openings 168a and 168b.

As illustrated above, when the reaction layer 175 contacts the oxide semiconductor pattern 155, oxygen atoms or oxygen ions included in the oxide semiconductor pattern 155 may be moved or transferred into the reaction layer 175. Thus, portions of the oxide semiconductor pattern 155 which contact the reaction layer 175 may be transformed into low resistance patterns 145 that may be relatively deficient in oxygen. In exemplary embodiments, the low resistance pattern 145 may include oxygen vacancies, and the oxygen vacancies may function as carriers so that the low resistance pattern 145 may have an enhanced electrical conductivity and a low resistance.

In one exemplary embodiment, a thermal treatment or an exposure process may be further performed to facilitate the reaction between the reaction layer 175 and the oxide semiconductor pattern 155.

As the low resistance pattern 145 is provided, a central portion of the oxide semiconductor pattern 155 which is substantially superimposed over the gate electrode 110 may be defined as the channel portion 135. Peripheral portions of the oxide semiconductor pattern 155 which contact the source electrode 185 and the drain electrode 195 may be defined as contact portions 147.

According to exemplary embodiments, the low resistance pattern 145 may be provided between the contact portion 147 and the channel portion 135, so that mobility of charges and/or ions through the channel portion 135 may be improved.

Additionally, the reaction layer 175 may cover the source electrode 185, the drain electrode 195 and the channel passivation layer 165. Thus, the reaction layer 175 may substantially function as a passivation layer, so that an additional formation of the passivation layer may not be needed.

Furthermore, the source electrode 185 and the drain electrode 195 may be provided in the first openings 167a and 167b that may be provided during a patterning process for the channel passivation layer 165. Thus, a formation of additional contact holes for the source electrode 185 and the drain electrode 195 may be omitted.

Figure 14:
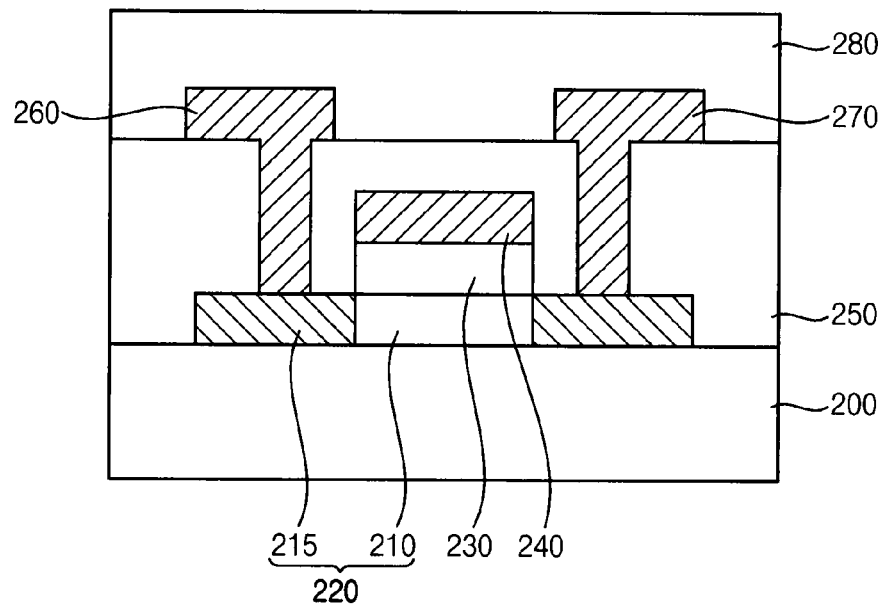

FIG. 14 is a cross-sectional view illustrating a TFT in accordance with exemplary embodiments. For example, FIG. 14 illustrates a TFT having a top gate structure in which a gate electrode is disposed on a semiconductor pattern.

Methods of manufacturing the TFT are also described with reference to FIG. 14. Detailed descriptions on elements, constructions, materials and/or processes substantially the same as or similar to those illustrated with reference to FIGS. 1 to 7 are omitted.

Referring to FIG. 14, the TFT may include an oxide semiconductor pattern 220 disposed on a substrate 200, and a gate insulation layer 230 and a gate electrode 240 sequentially stacked on the oxide semiconductor pattern 220.

The oxide semiconductor pattern 220 may be provided by depositing an oxide semiconductor layer on the substrate 200, and then patterning the oxide semiconductor layer. In one exemplary embodiment, a buffer layer (not illustrated) may be disposed on the substrate 200, and the oxide semiconductor pattern 220 may be disposed on the buffer layer.

An insulation layer covering the oxide semiconductor pattern 220 may be disposed on the substrate 200 using an insulation material, for example, silicon oxide, and a conductive layer may be disposed on the insulation layer. The conductive layer may be partially removed by, e.g., a photolithography process to provide the gate electrode 240. The insulation layer may be partially removed using the gate electrode 240 as an etching mask to provide the gate insulation layer 230.

In FIG. 14, the gate electrode 240 and the gate insulation layer 230 are illustrated to have substantially rectangular cross sections. However, at least one of the gate electrode 240 and the gate insulation layer 230 may have a substantially trapezoidal cross section.

A reaction layer 250 may be disposed on the substrate 200 and the oxide semiconductor pattern 220 to cover the gate electrode 240 and the gate insulation layer 230. The reaction layer 250 may be provided using a metal oxide such as aluminum oxide having a low density.

As the reaction layer 250 contacts the oxide semiconductor pattern 220, oxygen atoms or oxygen ions included in the oxide semiconductor pattern 220 may be moved or transferred into the reaction layer 250. Accordingly, portions of the oxide semiconductor pattern 220 which contact the reaction layer 250 may be transformed into low resistance patterns 215. A portion of the oxide semiconductor pattern 220 which is located between the low resistance patterns 215 and substantially overlaps with the gate insulation layer 230 and the gate electrode 240 may be defined as a channel portion 210.

A source electrode 260 and a drain electrode 270 may contact the low resistance patterns 215 through the reaction layer 250. In exemplary embodiment, the reaction layer 250 may be partially etched to define openings partially exposing the low resistance patterns 215. A conductive layer sufficiently filling the openings may be disposed on the reaction layer 250, and then the conductive layer may be patterned to provide the source electrode 260 and the drain electrode 270.

In exemplary embodiments, the source electrode 260 and the drain electrode 270 may be disposed on the reaction layer 250 not to be superimposed over the gate electrode 240.

Accordingly, a parasitic capacitance generated between the source electrode 260 and the gate electrode 240 and/or between the drain electrode 270 and the gate electrode 240 may be reduced.

A passivation layer 280 covering the source electrode 260 and the drain electrode 270 may be disposed on the reaction layer 250.

Hereinafter, resistance properties of oxide semiconductor patterns are described with reference to Examples and Comparative Example.

In the Examples, an oxide semiconductor layer was disposed on a substrate using ITZO by a sputtering process, and then the oxide semiconductor layer was patterned to provide an oxide semiconductor pattern. A reaction layer covering the oxide semiconductor pattern was disposed on the substrate using aluminum oxide to transform the oxide semiconductor pattern into a low resistance pattern. After obtaining the low resistance pattern, the reaction layer was removed, and then a resistance value of the low resistance pattern was measured in ohm centimeter ($\Omega$cm).

The resistance values were repeatedly measured varying layer densities of the reaction layer.

In the Comparative Example, a resistance value of the oxide semiconductor pattern was measured before providing the reaction layer.

The measured results of Examples and Comparative Example are shown in Table 1 below.

TABLE 1

| | Examples | | | | | | Comparative Example |
|---|---|---|---|---|---|---|---|
| Layer Density (g/cm$^3$) | 3.7 | 3.5 | 3.3 | 3.0 | 2.5 | 2.0 | — |
| Resistance ($\Omega$cm) | 0.014 | 0.012 | 0.008 | 0.002 | 0.001 | 0.001 | 0.014 |

Figure 15:
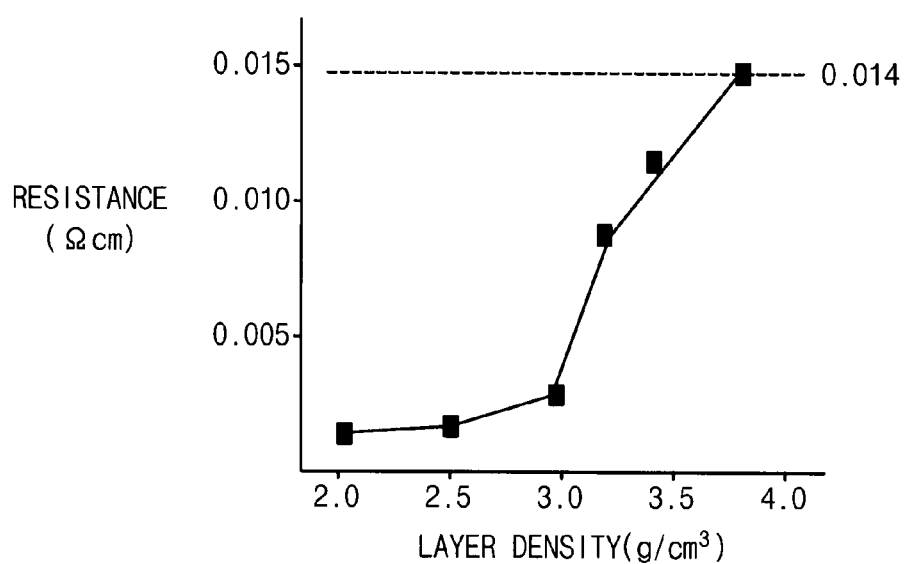

FIG. 15 is a graph showing measured resistance values of the oxide semiconductor patterns in accordance with Examples and Comparative Example.

Referring to Table 1 and FIG. 15, when the layer density of the reaction layer was 3.7, the oxide semiconductor pattern had substantially the same resistance value as that of Comparative Example. Thus, the oxide semiconductor pattern was not substantially transformed into the low resistance pattern by the reaction layer. When the layer density of the reaction layer was less than 3.7, the resistance value of the oxide semiconductor pattern was effectively reduced compared to that of Comparative Example.

Particularly, when the layer density became less than about 3.3, the resistance value was drastically reduced. Therefore, the low resistance pattern having a sufficiently reduced resistance value may be obtained by using the reaction layer with the layer density of less than about 3.3.

However, when the layer density reached about 2.0, the resistance value of the oxide semiconductor pattern was not reduced by a significant level.

The reaction layer was provided by an ALD process and a PLD process instead of the sputtering process. In this case, the layer density of the reaction layer was not reduced below about 4.0 g/cm$^3$.

Figure 16:
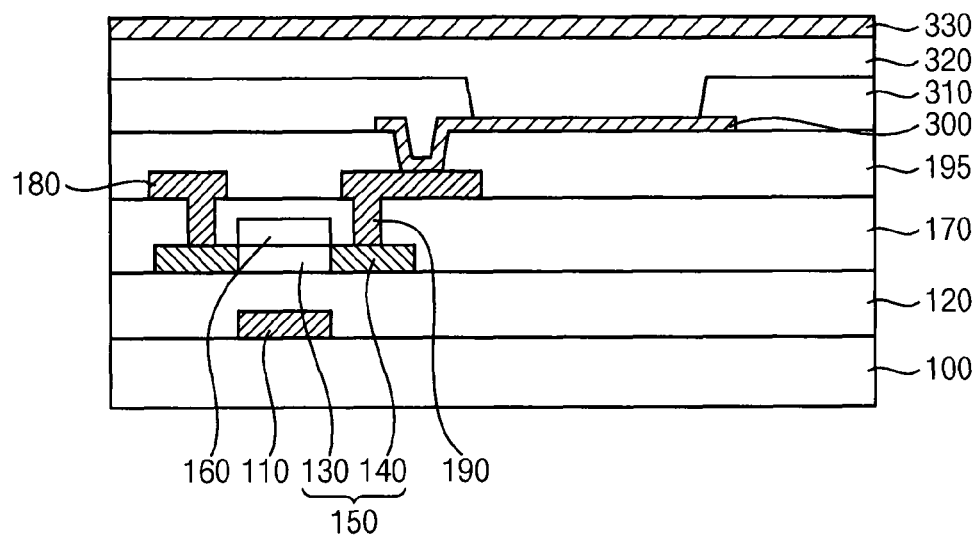

FIG. 16 is a cross-sectional view illustrating a display device in accordance with exemplary embodiments. For example, FIG. 16 illustrates an organic light emitting display ("OLED") device including the TFT described above. However, the TFT according to exemplary embodiments may be also employed in other types of the display device, for example, a liquid crystal display ("LCD") device or a flexible display device. Detailed description on elements and/or constructions substantially the same as or similar to those illustrated with reference to FIG. 1 are omitted.

Referring to FIG. 1, the display device may include the TFT according to exemplary embodiments and an organic light emitting structure electrically connected to the thin film transistor.

As described with reference to FIG. 1, the TFT may include a gate electrode 110, a gate insulation layer 120, a semiconductor pattern 150 including a channel portion 130 and a low resistance pattern 140, a channel passivation layer 160, a reaction layer 170, a source electrode 180, a drain electrode 190 and a passivation layer 195 on a substrate 100.

In exemplary embodiments, the TFT may have a structure substantially the same as or similar to that illustrated with reference to FIG. 8 or FIG. 14.

The organic light emitting structure may be disposed on the thin film transistor. The organic light emitting structure may include a first electrode 300, a pixel defining layer 310, an organic light emitting layer ("EML") 320 and a second electrode 330.

The first electrode 300 may be electrically connected to the drain electrode 190 through a contact hole defined in the passivation layer 195. In an exemplary embodiment, the first electrode 300 may include a transparent conductive material including ITO, ZTO, IZO, zinc oxide, tin oxide or any combinations thereof, or a metal including Cr, Al, Ta, Mo, Ti, W, Cu, Ag or Nd or an alloy of the metal. The first electrode 300 may function as a pixel electrode and/or an anode of the display device.

The pixel defining layer 310 may be disposed on the passivation layer 195 to cover peripheral portions of the first electrode 300. The pixel defining layer 310 may define a pixel region of the display device, and a portion of the first electrode 300 not covered by the pixel defining layer 310 may substantially correspond to an area of the pixel region. In an exemplary embodiment, the pixel defining layer 310 may include photosensitive material including polyimide resin, acryl resin or a combination thereof. In an alternative exemplary embodiment, the pixel defining layer 310 may include a non-photosensitive organic material or an inorganic material.

The EML 320 may be disposed on the pixel defining layer 310 and the first electrode 300 exposed by the pixel defining layer 310. In one exemplary embodiment, a hole transport layer ("HTL") (not illustrated) may be further disposed between the first electrode 300 and the EML 320.

The EML 320 may include at least one of light emitting materials for generating different colors of light, for example, a red color of light, a green color of light or a blue color of light. In exemplary embodiments, the EML 320 may include any combinations of the light emitting materials for generating a white color of light.

The HTL may include a hole transport material, for example, 4,4'-bis[N-(1-naphtyl)-N-phenylamino]biphenyl ("NPB"), 4,4'-bis[N-(3-methylphenyl)-N-phenylamino]biphenyl ("TPD"), N,N'-di-1-naphtyl-N,N'-diphenyl-1,1'-biphenyl-4,4'-diamine ("NPD"), N-phenylcarbazole, polyvinylcarbazole or any combinations thereof.

As illustrated in FIG. 16, the EML 320 may be disposed on surfaces of the pixel defining layer 310 and the first electrode 300. In an alternative exemplary embodiment, the EML 320 may be confined by sidewalls of the pixel defining layer 310.

The second electrode 330 may be disposed on the EML 320. The second electrode 330 may include a metal including Li, Ca, lithium fluoride/calcium (LiF/Ca), LiF/Al, Al, Mg, Ag, Cr, W, Mo or Ti or an alloy thereof. In one exemplary embodiment, the second electrode 330 may include a transparent conductive material including ITO, IZO, ZTO, tin oxide, zinc oxide or any combinations thereof. The second electrode 330 may function as a cathode of the display device.

The second electrode 330 may be disposed on a substantially entire surface of the display device. In an alternative exemplary embodiment, the second electrode 330 may be patterned in each pixel.

In one exemplary embodiment, an electron transport layer ("ETL") (not illustrated) may be further disposed between the second electrode 330 and the EML 320. The ETL may include an electron transport material, for example, tris(8-quinolinolato)aluminum (Alq3), 2-(4-biphenylyl)-5-4-tert-butylphenyl-1,3,4-oxadiazole ("PBD"), bis(2-methyl-8-quinolinolato)-4-phenylphenolato-aluminum (BAlq), bathocuproine ("BCP") or any combinations thereof.

Figure 17:
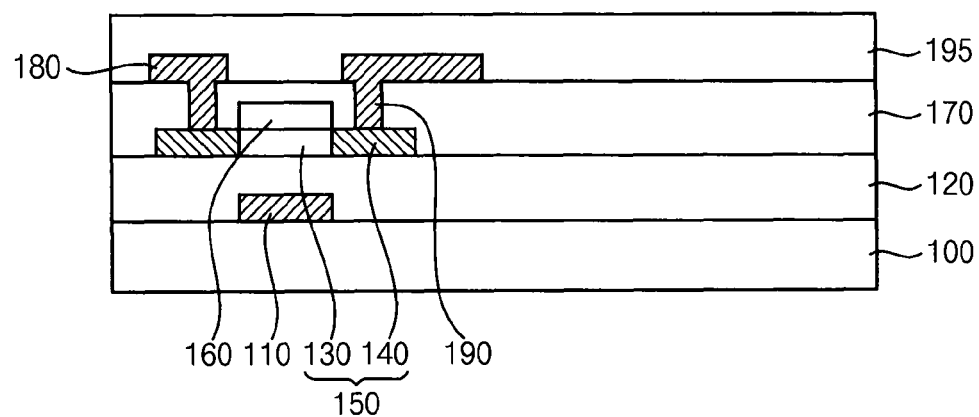
Figure 18:
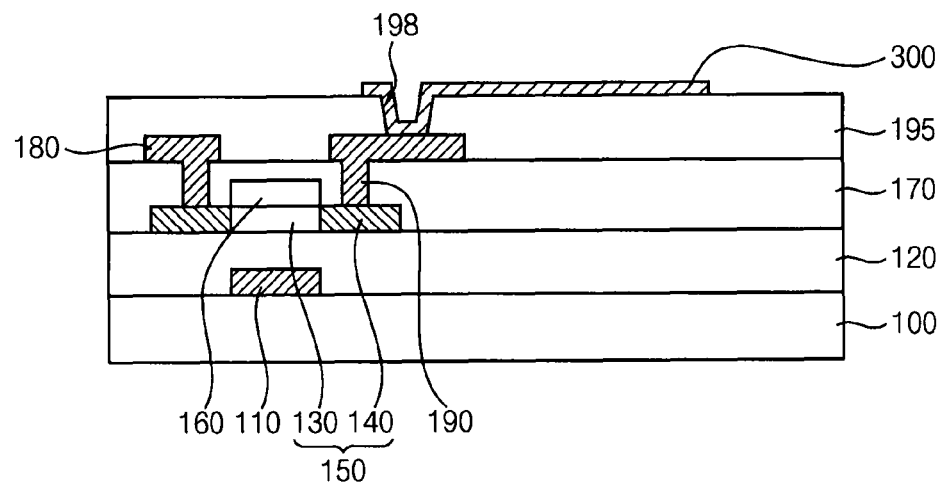
Figure 19:
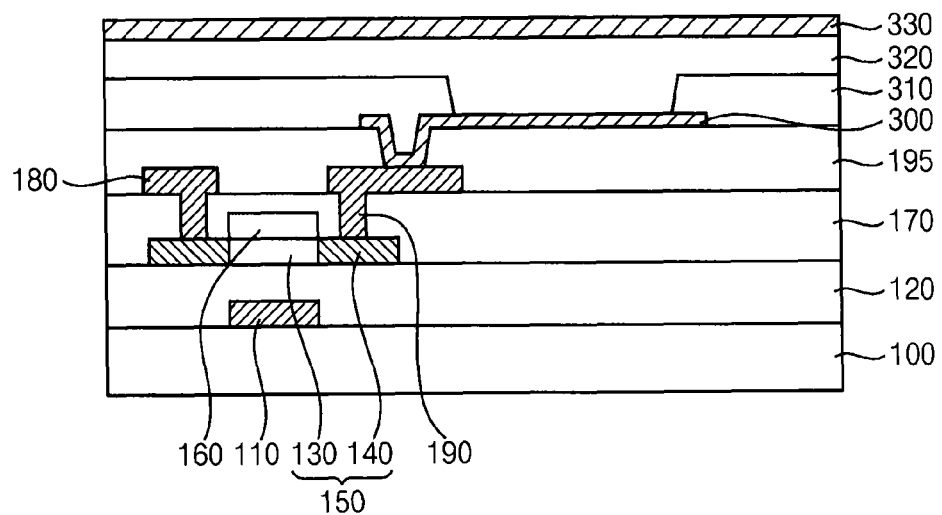

FIGS. 17 to 19 are cross-sectional views illustrating a method of manufacturing a display device in accordance with exemplary embodiments.

Referring to FIG. 17, processes substantially the same as or similar to those illustrated with reference to FIGS. 2 to 7 may be performed to provide the TFT according to exemplary embodiments. Accordingly, the TFT including a gate electrode 110, a gate insulation layer 120, a semiconductor pattern 150 including a channel portion 130 and a low resistance pattern 140, a channel passivation layer 160, a reaction layer 170, a source electrode 180, a drain electrode 190 and a passivation layer 195 disposed on a substrate 100 may be obtained.

In exemplary embodiments, the TFT may be obtained by processes substantially the same as or similar to those illustrated with reference to FIGS. 9 to 14.

Referring to FIG. 18, a first electrode 300 electrically connected to the drain electrode 190 may be provided through a contact hole 198 defined in the passivation layer 195.

In exemplary embodiments, the passivation layer 195 may be partially removed to define the contact hole 198 at least partially exposing a top surface of the drain electrode 190. A conductive layer may be disposed on the passivation layer 195, sidewalls of the contact hole 198 and a bottom surface of the contact hole 198. The conductive layer may be patterned to provide the first electrode 300.

In an exemplary embodiment, the conductive layer may be provided using a transparent conductive material including ITO, ZTO, IZO, zinc oxide, tin oxide or any combinations thereof, a metal such as Cr, Al, Ta, Mo, Ti, W, Cu, Ag or Nd, or an alloy of the metal. In an exemplary embodiment, the conductive layer may be obtained by a sputtering process, a CVD process, an ALD process, a vacuum evaporation process, a printing process, etc.

Referring to FIG. 19, a pixel defining layer 310 covering peripheral portions of the first electrode 300 may be disposed on the passivation layer 195 to define a pixel region of the display device. An EML 320 and a second electrode 330 may be sequentially disposed on the pixel defining layer 310 and the first electrode 300.

In exemplary embodiments, a photosensitive material layer including, e.g., acryl resin, polyimide resin or benzocyclobutene ("BCB") may be disposed on the passivation layer 195 and the first electrode 300. The photosensitive material layer may be patterned by an exposure process and a developing process to provide the pixel defining layer 310. In an alternative exemplary embodiment, non-photosensitive organic or inorganic layers may be disposed on the passivation layer 195 and the first electrode 300, and then the non-photosensitive organic or inorganic layers may be partially etched to provide the pixel defining layer 310.

The EML 320 may be provided using at least one of light emitting materials for generating different colors of light, for example, a red color of light, a green color of light or a blue color of light. In exemplary embodiments, the EML 320 may be provided using any combinations of the light emitting materials for generating a white color of light. In an exemplary embodiment, the EML 320 may be provided by a spin coating process, a roll printing process, a nozzle printing process, an inkjet printing process, a transfer process using a donor substrate, etc.

The EML 320 may be disposed on entire surfaces of the pixel defining layer 310 and the first electrode 300 as illustrated in FIG. 19. In an alternative exemplary embodiment, the EML 320 may be patterned to be confined by sidewalls of the pixel defining layer 310.

In one exemplary embodiment, an HTL may be further provided between the EML 320 and the first electrode 300 using the above mentioned hole transport material. In one exemplary embodiment, an ETL may be further disposed on the EML 320 using the above mentioned electron transport material. In an exemplary embodiment, the HTL and the ETL may be provided by a spin coating process, a roll printing process, a nozzle printing process, an inkjet printing process, a transfer process using a donor substrate, etc.

In an exemplary embodiment, the second electrode 330 may be provided using a metal including Li, Ca, LiF/Ca, LiF/Al, Al, Mg, Ag, Cr, W, Mo or Ti or an alloy thereof. In one exemplary embodiment, the second electrode 330 may be provided using a transparent conductive material including ITO, IZO, ZTO, tin oxide, zinc oxide or any combinations thereof. In an exemplary embodiment, the second electrode 330 may be obtained by a sputtering process, a CVD process, an ALD process, a vacuum evaporation process, a printing process, etc.

The second electrode 330 may be disposed on a substantially entire surface of the display device. In an alternative exemplary embodiment, the second electrode 330 may be patterned in each pixel.

According to exemplary embodiments of the invention, an oxide semiconductor pattern of a TFT may include a low resistance pattern, so that a parasitic capacitance generated between a gate electrode and other electrodes may be effectively reduced, and electrical or operational characteristics of the TFT may be improved.

Therefore, the TFT may be applied to various display devices including an OLED device, an LCD device, a transparent flexible display device, etc., to improve image qualities and electrical properties thereof.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A thin film transistor, comprising:
a gate electrode on a substrate;
a gate insulation layer which covers the gate electrode on the substrate;
an oxide semiconductor pattern which is disposed on the gate insulation layer and includes:
   a channel portion superimposed over the gate electrode; and
   low resistance patterns provided at edges of the channel portion, respectively, and including oxygen vacancies;
a channel passivation layer on the oxide semiconductor pattern;
a reaction layer which covers the oxide semiconductor pattern and the channel passivation layer, and contacts the low resistance patterns, the reaction layer including a metal oxide and inducing the oxygen vacancies of the low resistance patterns; and
a source electrode and a drain electrode which contact the low resistance patterns, the source electrode and the drain electrode being formed on the reaction layer and extending through the reaction layer,
wherein the source electrode and the drain electrode are nonoverlapping with the gate electrode.

2. The thin film transistor of claim 1, wherein the reaction layer includes aluminum oxide.

3. The thin film transistor of claim 1, wherein the reaction layer further includes oxygen atoms or oxygen ions transferred from the oxide semiconductor pattern.

4. The thin film transistor of claim 3, wherein the low resistance patterns have an oxygen content ratio lower than that of the channel portion.

5. The thin film transistor of claim 1, wherein the reaction layer has a layer density in a range from about 2.0 grams per cubic centimeter to about 3.7 grams per cubic centimeter.

6. The thin film transistor of claim 5, wherein the reaction layer has the layer density in a range from about 2.0 grams per cubic centimeter to about 3.3 grams per cubic centimeter.

7. The thin film transistor of claim 1, wherein the reaction layer has a thickness in a range from about 10 nanometers to about 100 nanometers.

8. The thin film transistor of claim 1, wherein the source electrode and the drain electrode contact the low resistance patterns, respectively, through contact holes defined in the reaction layer.

9. The thin film transistor of claim 1, wherein the source electrode and the drain electrode are separated from the gate electrode in a plan view.

10. The thin film transistor of claim 1,
wherein the oxide semiconductor pattern further includes contact portions which contact the source electrode and the drain electrode, respectively, and
wherein the low resistance patterns are respectively located between the contact portion and the channel portion.

11. The thin film transistor of claim 10, wherein the channel passivation layer includes a central portion superimposed over the gate electrode, and a peripheral portion which partially covers the contact portion.

12. The thin film transistor of claim 11, wherein the reaction layer covers the channel passivation layer, the source electrode and the drain electrode.

13. A display device, comprising:
a gate electrode on a substrate;
a gate insulation layer which covers the gate electrode on the substrate;
an oxide semiconductor pattern which is disposed on the gate insulation layer, and includes:
   a channel portion superimposed over the gate electrode; and
   low resistance patterns provided at edges of the channel portion and including oxygen vacancies;
a channel passivation layer on the oxide semiconductor pattern;
a reaction layer which covers the oxide semiconductor pattern and the channel passivation layer, and contacts the low resistance patterns, the reaction layer including a metal oxide and inducing the oxygen vacancies of the low resistance patterns;
a source electrode and a drain electrode which contact the low resistance patterns, wherein the source electrode and the drain electrode are formed on the reaction layer and extend through the reaction layer, and the source electrode and the drain electrode are nonoverlapping with the gate electrode;
a first electrode electrically connected to the drain electrode;
an organic light emitting layer on the first electrode; and
a second electrode on the organic light emitting layer.

* * * * *